United States Patent [19]

Olson et al.

[11] Patent Number: 5,273,816

[45] Date of Patent: Dec. 28, 1993

[54] LAMINATE BOARD POSSESSING IMPROVED DIMENSIONAL STABILITY

[75] Inventors: Larry D. Olson, Viroqua; Maureen D. Burkhardt, Onalaska; Henry R. Johnson, West Salem, all of Wis.

[73] Assignee: Allied-Signal Inc., Morris Township, Morris County, N.J.

[21] Appl. No.: 753,476

[22] Filed: Aug. 30, 1991

[51] Int. Cl.$^5$ .............................................. B32B 7/00
[52] U.S. Cl. .................................. 428/272; 428/273; 428/280; 428/285; 428/287; 428/413; 428/417; 428/901; 428/902
[58] Field of Search ............... 428/417, 251, 267, 268, 428/273, 285, 287, 413, 290, 901, 902, 280, 272

[56] References Cited

U.S. PATENT DOCUMENTS

| | | | |
|---|---|---|---|
| 4,751,126 | 6/1988 | Oodaira et al. | 428/139 |
| 4,960,634 | 10/1990 | Boyko et al. | 428/209 |
| 4,997,702 | 3/1991 | Gazit et al. | 428/209 |
| 5,075,155 | 12/1991 | Jellinek et al. | 428/901 |
| 5,162,977 | 11/1992 | Paurus et al. | 428/209 |

OTHER PUBLICATIONS

IPC Dimensional Stability Test 2.4.39 (The Institute for Interconnecting and Packaging Electronic Circuits).
IPC Resin Flow test 2.3.17.2 (The Institute for Interconnecting and Packaging Electronic Circuits).

*Primary Examiner*—James J. Bell
*Attorney, Agent, or Firm*—Harold N. Wells; Mary Jo Boldingh; Jay P. Friedenson

[57] ABSTRACT

A laminate which has improved dimensional stability may be prepared by impregnating a reinforcing substrate such as a woven glass cloth with an epoxy resin system having a relatively high molecular weight, in excess of about 850, in the presence of a curing agent followed by curing, pressing and post-baking substrate to form the desired laminate board. The variation in this dimensional stability can also be improved by utilizing a B-stage substrate which has been cured to a lower flow percentage.

14 Claims, No Drawings

LAMINATE BOARD POSSESSING IMPROVED DIMENSIONAL STABILITY

BACKGROUND OF THE INVENTION

This invention relates generally to improvements in the laminated circuit boards used in electronic circuitry. Those boards which are used in relatively complicated pieces of equipment, such as main frame computers, must be of a high standard of quality in order to function in an efficient manner for a long period of time without failure. A lower standard of quality is adequate for consumer products such as personal computers, television equipment, radios, and the like.

Circuit boards usually comprise a multi-layer composite made of layers comprising a thermosetting polymer and a suitable reinforcing material. A major problem with multi-layer composites is the dimensional stability of the inner layers. When processing the composite, the inner layers are subjected to stress as the polymers thermoset and the temperature changes and the layers may expand or contract. This may cause registration problems, that is, the inner layers may not be interconnected at the intended places because they have moved during expansion or contraction. Failure to interconnect layers can be a cause for either failure or rejection of the composite.

Another area in which thermal expansion plays an important role is in carriers for silicon chips which are used in integrated circuitry. Silicon chips may be mounted on a chip carrier, such as ceramic or plastic which in turn is mounted on a chip carrier substrate or circuit board. In some instances, it is important that the electrical connection between the chip carrier and the chip carrier substrate is hermetically sealable and can withstand temperature cycling. When the package is subjected to temperature extremes, the solder joints may fracture causing an electrical open. In order to overcome this problem, the chip carrier or chip carrier substrate should have a rate of thermal expansion which assures that the soldered joints will not fracture during thermal cycling. Preferably, such materials should be dimensionally stable, that is, each layer of the laminates should expand or contract the same amount as the temperature changes.

BRIEF SUMMARY OF THE INVENTION

This invention relates to laminated circuit boards which have improved dimensional stability, that is, temperature cycling causes less distortion of the laminate. Such laminates are produced by impregnating a reinforcing substrate with a thermosetting polymeric resin, particularly epoxy resins. The impregnated reinforcement is B-staged and then cured. According to the invention, the dimensional stability of the resulting laminate is improved by adjusting the resin molecular weight or by adjusting resin flow.

One aspect of this invention is found in a laminated circuit board which has improved dimensional stability, by adjusting the resin molecular weight relative to a laminate with poor dimensional stability. If too negative, the dimensional stability is made more positive by increasing the molecular weight and thereby decreasing the shrinkage on cure of the base resin. If too positive, the dimensional stability is made more negative by decreasing the molecular weight and thereby increasing the shrinkage on cure of the base resin.

A second aspect of this invention is found in a laminated board which has improved dimensional stability, by being prepared with resin cured to a lower flow percentage than laminate material which exhibits wide variation in its dimensional stability. By decreasing the flow percentage of substrate material used to manufacture said laminate, an improvement in dimensional stability is obtained.

DETAILED DESCRIPTION OF THE INVENTION

As the polymers used in laminated circuit boards cure the resin generally shrinks. In order to reduce the amount of shrinkage on cure, the number of reaction sites available for crosslinking should be reduced. On the other hand, the resin must be uniformly distributed through the reinforcing fibers and this requires relatively fluid resin, which implies that significant crosslinking will be necessary in order to obtain thermally, chemically and mechanically stable laminates. We have now discovered that adjusting the molecular weight of a thermosetting resin improves dimensional stability of the resulting laminate board. It has also been discovered that if the resin flow percentage is altered that dimensional stability ca be improved.

This invention encompasses two methods of affecting dimensional stability. The first—adjusting the molecular weight of the initial resin—improves dimensional stability by shifting the nominal dimensional stability in a positive or negative direction. The second —adjusting resin flow during B-staging and lamination—reduces dimensional stability variation and gives more consistent dimensions. The combination of these two factors allows laminates to be made with superior dimensional stability.

In one aspect, laminated boards may be prepared by impregnating reinforcing fibers with an epoxy resin which possesses a relatively high molecular weight, that is, a molecular weight in excess of about 850. In addition, preparing prepregs with epoxy resins cured to a lower flow percentage can improve dimensional stability variation since less stress is induced into the finished laminate.

By "dimensional stability" we mean the relative change in dimensions of a laminated board during the curing process. Since such boards are commonly made of multiple "prepreg" layers i.e. partially cured or "B-staged" layers of resin-impregnated reinforcing fibers, the layers should expand or contract the same amount in order to be dimensionally stable. A conventional test is the IPC Dimensional Stability Test 2.4.39 (The Institute for Interconnecting and Packaging Electronic Circuits) in which samples of a laminate are subjected to temperature cycling and the resulting changes in dimensions measured in both the warp and fill directions of the reinforcing fabric—the results are presented as mils/inch ($10^3$ mm/mm) which represents the change in the measured dimension after heating and compared to the original measurement.

The term "flow" or "flow percentage" as used herein means the amount of the resin which is extruded when a green laminate is pressed and heated, as measured by the IPC Resin Flow test 2.3.17.2. The test measures the amount of resin extruded from a laminate sample under temperature and pressure. A high value indicates that the resin is less cured and more fluid than a resin which has a low flow value in such a test. Epoxy resins should be cured to provide flow percentages less than about 12% according to the invention.

In a preferred embodiment of the present invention, the resin is reinforced with a woven or non-woven material such as aramide fibers, glass fibers, and the like. The impregnation of the fibrous material may be effected in any manner known in the art, such as passing the substrate through a solution of the high molecular weight resin at a predetermined temperature. Following impregnation, the fibrous material may then be passed through metering rolls so that the selected amount of resin is retained in the fibrous material, while any excess is squeezed out. Generally speaking, the resin content of the impregnated material may be in a range of from about 10% to about 90% by weight of said cloth.

Some specific examples of the resin systems which may be employed in the process of the present invention include EPON resins from the Shell Chemical Company, which resins are the reaction products of epichlorohydrin and bisphenol-A. These series of resins are sold under the name of EPON 813, EPON 815, EPON 812, EPON 8201, EPON 825, EPON 826, EPON 828, EPON 8280, EPON 830, EPON 834, EPON 871, etc. Other epoxy resins which may be used include Dow 511, Dow 521, and Dow 531 (Dow Chemical Co.)

The methods of the invention are believed to be applicable also to other thermosetting resins including polyimide, bismaleimide, triazine, and cyanate ester resins.

The resin solution will include a curing agent, depending upon the type of resin system which has been chosen as the impregnating agent. Examples of curing agents which may be employed will include aliphatic amines such as diethylene triamine, triethylene tetraamine, and/or amides of the cyanoguanidine type.

Solvents such as ketones, including methyl ethyl ketone, diethyl ketone, etc., N-methyl-2-pyrrolidone, etc., benzene, toluene, etc., typically are employed to form the solution of the resin system and the curing agent. The solution may also contain accelerators such as 2-methyl imidazole, BDMA, butadiene acrylonitrile, 2-ethyl-4-methyl imidazole, 2-phenylimidazole, 2-undecyl imidazole, 2-heptadecyl imidazole, etc., including their cyanoethyl and trimellitate derivatives.

The impregnated cloth may be subjected to a B-stage cure by placing it in a heating oven which is maintained at a temperature in a range of from about 150° to about 190° C. and cured to a lower flow percentage than that found in a laminate exhibiting poor dimensional stability. Thereafter, the impregnated cloth may be laid-up utilizing a predetermined number of plies with at least one sheet of a conductive metal and pressed at a temperature which may range from about 150° to about 200° C. and a pressure in the range of from about 100 to about 2000 psig (689.5–13,789 kPa gauge) to provide the desired laminate. The finished multi-layer laminates may be used for circuit boards or as chip-carrier substrates in a wide variety of electrical o electronic equipment. The resulting laminates exhibit improved dimensional stability as well as a thermal stability and thus are used in situations where the equipment is subject to thermal cycling.

EXAMPLE 1

An impregnating solution was prepared by mixing 625.6 grams of a bisphenol A-type epoxy resin (Dow XUR2) possessing an epoxy equivalent weight of 1025 and a molecular weight of 3198, 134.5 grams of acetone, 134.5 grams of dimethylformamide, 9.0 grams of dicyandiamide, 72.0 grams of methylcellosolve, 0.4 grams of methylimidazole and an additional 24.0 grams of dimethylformamide. After admixing the components, an additional 350 g of dimethylformamide was added to bring the solids content of the solution to 47%. Sheets of woven glass cloth (1080 glass style with a 307 finish from Clark-Schwebel) measuring 12 inches by 12 inches (304.8 mm×304.8 mm) were dipped into this solution followed by removal of the excess solution and curing for a period of 4 minutes at a temperature of 176° C. Three 11 inch×12 inch (279.4 mm×304.8 mm) laminates were prepared in the following manner. Each laminate was made by pressing two sheets of this 1080 style impregnated glass cloth, for a period of 1 hour at a temperature of 176° C. with a heat up rate of approximately 18°-22° F. per minute (10°-12° C./min), between % two sheets of 1.4 mil (0.0356 mm) copper foil treated for epoxy resins. The laminate was pressed between two stainless steel plates with one piece of corrugated cardboard padding per side at a pressure of 300 psig (2068 kPa gauge). The pressed board was then postbaked for a period of 4 hours at a temperature of 163° C.

EXAMPLE 2

Three 11 inch by 12 inch (279.4 mm×304.8 mm) laminates were prepared with a bisphenol A-type epoxy resin which possessed a lower epoxy equivalent weight and molecular weight. The epoxy resin (Dow XUR3) had an epoxy equivalent weight of 885 with a molecular weight of 2996. The impregnating solution was prepared by admixing 613 grams of epoxy resin, 131.5 grams of acetone, 159.5 grams of dimethylformamide, 10.5 grams of dicyandiamide, 85.1 grams of methylcellosolve, and 0.44 grams of 2-methylimidazole. After a mixture of the components of the solution, an additional 326.5 grams of dimethylformamide was added to bring the solids content of the solution to 47%. Sheets of woven glass cloth (1080 style with a 307 finish from Clark-Schwebel) were immersed in this solution and the excess solution was removed to achieve a resin content of 60%. The impregnated cloth was cured for a period of 4.25 minutes at a temperature of 176° C. To form the laminate board, 2 sheets of the 1080 style impregnated cloth were pressed for a period of one hour, at a temperature of 176° C. and a pressure of 300 psig (2068 kPa gauge). Glass cloth was laid-up between two sheets of 1.4 mil (0.0356 mm) copper and placed in a press between two stainless steel plates and 1 sheet cardboard padding per side. Following this the board was postbaked for a period of 4 hours at a temperature of 163° C.

EXAMPLE 3

In a manner similar to that set forth in the above examples, an epoxy resin solution was prepared utilizing a bisphenol A-type epoxy resin (FR-4) which had an epoxy equivalent weight of 425 and a molecular weight of 2622. The solution was used to impregnate a woven glass cloth similar to that used in the above examples. After impregnation, the cloth was used to prepare laminates as in the previous examples. Three laminates were manufactured.

EXAMPLE 4

Laminates prepared according to Examples 1 to 3 above, were labeled 1, 2, and 3. These boards were then tested to determine their dimensional stability using the IPC Dimensional Stability Test previously mentioned. The tests were performed by measuring the distance between two sets of points marked on the laminate boards via a test pattern, etching the boards followed by baking at a temperature of 105° C. for a period of 4 hours. The boards were then remeasured followed by an additional baking for a period of 2 hours at a temperature of 150° C. and again remeasured. The stability of the boards in the warp and fill directions are set forth in the table below.

| Panel | # of laminates | Dimensional Stability (mils/in.) ($10^{+3}$ mm/mm) | | | |
|---|---|---|---|---|---|
| | | 4 Hrs. at 105° C. | | 2 Hrs. at 150° C. | |
| | | Fill | Warp | Fill | Warp |
| 1 | 3 | −.17 | +.16 | −.27 | +.16 |
| 2 | 3 | −.45 | −.06 | −.57 | −.03 |
| 3 | 3 | −.63 | −.18 | −.79 | −.25 |

A negative value indicates a shrinkage of the board as opposed to a plus value which indicates an expansion of the board.

It is noted from the above table that the panels prepared from resins which possess a relatively high molecular weight, that is, panels 1 & 2 possess a greater dimensional stability than panel 3 which was prepared from an epoxy resin of a lower molecular weight. The fill and warp dimensions of panels 1 and 2 changed less than panels prepared from a low molecular weight resin system (3) as indicated by the larger values, both negative and positive. In addition, the panels prepared from high molecular weight epoxy resins (1 and 2) also exhibited excellent and improved water absorption, peel strength and electric strength values as compared to the panel (3) prepared from a low molecular weight epoxy resin system.

EXAMPLE 5

Sixteen prepreg sheets were compared which had been prepared using FR-4 epoxy resin impregnating a 1080 fiber glass cloth with 307 finish (Clark-Schwebel). The sixteen sheets differed in that eight sheets had a high flow value of 40% and the other eight sheets had a low flow value of 1.9%, both being measured by the IPC test previously mentioned. A 4-ply 4 in×4 in (101.6 mm × 101.6 mm) sample of prepreg was pressed at 1380 kPa gauge and the amount of resin which was squeezed out of the sample press was measured and reported as the "% flow." The resin content of the high flow prepreg was 62% while that of the low flow prepreg was 64%. Dimensional stability was measured in the warp and fill directions of the samples which had a facing of 0.0014 in (0.0356 mm) copper foil on the faces.

The composite was heated using the following schedule:

| Temp. °C. | Pressure, kPa | Time, at temp. min |
|---|---|---|
| 82 | 345 | 9 |
| 82–176 | 6205 | 21 |
| 176 | 6205 | 30 |

Measurements between two points in the warp and fill directions were made after hot pressing the laminates.

The results are given in the following table for the average of eight sheets.

| | High Flow Samples | | Low Flow Samples | |
|---|---|---|---|---|
| | Warp | Fill | Warp | Fill |
| Average | −0.64 | −0.65 | −0.60 | −0.71 |
| Std. Dev. | 0.04 | 0.06 | 0.04 | 0.02 |
| Range | 0.12 | 0.19 | 0.12 | 0.05 |

It can be seen that the average shrinkage (i.e., a negative value) was similar for both the high and low samples. However, the range of values was much less for the low flow resin in the fill direction. This result does not account for the effect on dimensional stability of the difference in resin content. Since the high flow samples had a lower resin content the dimensional stability would be worsened if corrected to the same resin content as the low flow sample. Thus, the improved stability on the fill direction would be even better if correction to constant resin content were included.

EXAMPLE 6

Another set of eight laminates was prepared using a low flow FR-4 epoxy with 2113 style glass fabric with 49 wt. % resin content and 106 style glass fabric with 61 wt. % resin content having 3.5% flow by the procedure described in Example 5. The gel time was 62 sec. and 68 sec., respectively. Each laminate contained 2 layers of prepreg and had a layer of 0.0014 in (0.0356 mm) copper foil on each face. The laminates were heated and pressed according to the following schedule:

| Temp. °C. | Pressure, kPa | Time, at temp. min |
|---|---|---|
| 154 | 344 | 8 |
| 154 | 6205 | 17 |
| 177 | 6205 | 30 |

Measurements were made as described in Example 5 to determine dimensional stability in the warp and fill directions and compared with a control laminate prepared with a epoxy resin prepreg having 23% flow. Again, the effect of using a low flow resin was not significant in the warp direction but the dimensional stability was improved (i.e. less variation) by 25% in the fill direction. The average range for the eight laminates was 0.21 mil/in ($10^3$ mm/mm) for the low flow samples (3.5%) while the higher flow resin used in the control (23%) gave an average range of 0.28 mil/in ($10^3$ mm/mm).

We claim:

1. In a laminated board prepared by impregnating a reinforcing substrate with an epoxy resin and curing said resin under heat and pressure in the presence of a curing agent, the improvement comprising using an epoxy resin having a molecular weight above about 850, thereby providing improved dimensional stability in said laminated board.

2. The laminated board of claim 1 wherein said epoxy resin is a bisphenol-A type resin.

3. The laminated board of claim 1 wherein said substrate is a woven material selected from the group consisting of glass fibers and aramid fibers.

4. The laminated board of claim 1 wherein said substrate is a non-woven material selected from the group consisting of glass fibers or aramid fibers.

5. The laminated board of claim 1 wherein said dimensional stability is positive by the IPC test method and the epoxy resin molecular weight is decreased to provide improved dimensional stability.

6. The laminated board of claim 1 wherein said dimensional stability is negative by the IPC test method and the epoxy resin molecular weight is increased to provide improved dimensional stability.

7. In a laminated board prepared by impregnating a reinforcing substrate with an epoxy resin and curing said resin under heat and pressure in the presence of a curing agent, the improvement comprising using an epoxy resin having a flow percentage less than about 12% thereby providing improved dimensional stability in said laminated board.

8. The laminated board of claim 7 wherein said epoxy resin is a bisphenol-A type resin.

9. The laminated board of claim 7 wherein said substrate is a woven material selected from the group consisting of glass fibers and aramid fibers.

10. The laminated board of claim 7 wherein said substrate is a non-woven material selected from the group consisting of glass fibers and aramid fibers.

11. In a laminated board prepared by impregnating a reinforcing substrate with a resin and curing said resin under heat and pressure in the presence of a curing agent, the improvement comprising adjusting the molecular weight of said resin to improve dimensional stability in said laminated board.

12. The laminated board of claim 11 wherein said resin is selected from the group consisting of epoxy, polyimide, bismaleimide, triazine, and cyanate ester resins.

13. In a laminated board prepared by impregnating a reinforcing substrate with a resin and curing said resin under heat and pressure in the presence of a curing agent, the improvement comprising adjusting the flow percentage of said resin to improve dimensional stability in said laminated board.

14. The laminated board of claim 13 wherein said resin is selected from the group consisting of epoxy, polyimide, bismaleimide, triazine, and cyanate ester resins.

* * * * *